United States Patent
Lee et al.

(10) Patent No.: US 8,107,202 B2
(45) Date of Patent: Jan. 31, 2012

(54) MAGNETORESISTIVE SENSOR WITH NOVEL PINNED LAYER STRUCTURE

(75) Inventors: Wen-yaung Lee, San Jose, CA (US); Chang Man Park, Mountain View, CA (US); Brian R. York, San Jose, CA (US); Alexander M. Zeltser, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 530 days.

(21) Appl. No.: 12/345,733

(22) Filed: Dec. 30, 2008

(65) Prior Publication Data
US 2009/0257152 A1  Oct. 15, 2009

Related U.S. Application Data

(63) Continuation-in-part of application No. 12/101,761, filed on Apr. 11, 2008.

(51) Int. Cl.
*G11B 5/39* (2006.01)

(52) U.S. Cl. .................................................. 360/324.2
(58) Field of Classification Search ................ 360/324.2
See application file for complete search history.

(56) References Cited

U.S. PATENT DOCUMENTS

| | | | |
|---|---|---|---|
| 5,850,323 A | 12/1998 | Kanai | 360/113 |
| 6,581,272 B1 | 6/2003 | Li et al. | 29/603.14 |
| 6,903,904 B2 | 6/2005 | Li et al. | 360/324.11 |
| 6,909,583 B2 | 6/2005 | Li et al. | 360/324.1 |
| 7,423,848 B2 | 9/2008 | Horng et al. | 360/324.1 |
| 7,787,221 B2 * | 8/2010 | Nakabayashi et al. | 360/324.2 |
| 2008/0074807 A1 | 3/2008 | Carey et al. | 360/324.11 |

* cited by examiner

*Primary Examiner* — Allen Heinz
(74) *Attorney, Agent, or Firm* — Zilka-Kotab, PC

(57) ABSTRACT

A magnetoresistive sensor having an antiparallel coupled pinned layer structure including an AP1 layer and an AP2 layer. The AP2 layer includes two ferromagnetic layers AP2(*a*) and AP2(*b*), and a separation layer sandwiched therebetween. The AP2(*a*) layer is significantly larger than the AP2(*b*) layer, which results in strong pinning, while the separation layer provides increased TMR and reduced RA.

18 Claims, 6 Drawing Sheets

MAGNETORESISTIVE SENSOR WITH NOVEL PINNED LAYER STRUCTURE

RELATED INVENTIONS

The present invention is a Continuation in Part Application of commonly assigned U.S. patent application Ser. No. 12/101,761, entitled MAGNETORESISTIVE SENSOR WITH SUB-LAYERING OF PINNED LAYERS, filed on Apr. 11, 2008.

BACKGROUND OF THE INVENTION

1. Field of the Invention 761

Embodiments of the invention generally relate to magnetoresistive reader structures for sensing data stored on magnetic media.

2. Description of the Related Art

In an electronic data storage and retrieval system, a magnetic head typically includes a reader portion having a magnetoresistive (MR) sensor for retrieving magnetically encoded information stored on a magnetic recording medium or disk. The MR sensor includes multiple layers and operates based on a change of resistance of the MR sensor in the presence of a magnetic field. During a read operation, a sense current is passed through the MR sensor and magnetic flux emanating from a surface of the recording medium causes rotation of a magnetization vector of a sensing or free layer of the MR sensor, which in turn causes the change in resistance of the MR sensor. Passing the sense current through the MR sensor and then measuring change in bias voltage enables detection of the change in resistance.

SUMMARY OF THE INVENTION

The present invention provides a magnetoresistive sensor having an antiparallel coupled pinned layer structure including an AP1 layer and an AP2 layer. The AP2 layer includes two ferromagnetic layers AP2(a) and AP2(b), and a separation layer sandwiched therebetween. The AP2(a) layer is significantly larger than the AP2(b) layer, which results in strong pinning, while the separation layer provides increased TMR and reduced RA.

In one embodiment, a magnetic head includes a magnetoresistive read sensor having a free layer, a barrier layer and a pinned structure between the barrier layer and an antiferromagnetic pinning layer. The pinned structure includes a first pinned layer exchange coupled to the antiferromagnetic pinning layer, an antiparallel coupling layer, and a second pinned stack disposed between the barrier layer and the antiparallel coupling layer. The second pinned stack antiparallel coupled to the first pinned layer includes a compositionally distinct separation layer between a second pinned layer and a sub-second pinned layer.

A method for one embodiment relates to fabricating a magnetic head that has a magnetoresistive read sensor. The method includes depositing a free layer above a lower shield, depositing a barrier layer above the free layer, and depositing a sub-second pinned layer above the barrier layer, depositing a separation layer above the sub-second pinned layer, depositing a ferromagnetic second pinned layer above the separation layer, depositing an antiparallel-coupling layer above the second pinned layer, depositing a ferromagnetic first pinned layer above the antiparallel-coupling layer, and depositing an antiferromagnetic pinning layer above the first pinned layer. The separation layer that is deposited differs from the sub-second pinned layer and the second pinned layer.

For one embodiment, a hard disk drive includes a hard disk, an actuator arm, a slider disposed upon a distal end of the actual arm and positionable over the hard disk, and a read head disposed on the slider. The read head includes a tunneling magnetoresistance (TMR) read sensor stack between upper and lower ferromagnetic shields. The TMR read sensor stack includes a sensing ferromagnetic free layer deposited on the lower ferromagnetic shield, an electrically insulating nonmagnetic barrier layer deposited on free layer, a ferromagnetic sub-second pinned layer deposited on the barrier layer, a tantalum containing separation layer, a ferromagnetic second pinned layer deposited on the separation layer, an antiparallel-coupling layer deposited on the second pinned layer, a ferromagnetic first pinned layer deposited on the antiparallel-coupling layer, and an antiferromagnetic pinning layer deposited on the first pinned layer.

BRIEF DESCRIPTION OF THE DRAWINGS

So that the manner in which the above recited features of the present invention can be understood in detail, a more particular description of the invention, briefly summarized above, may be given by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
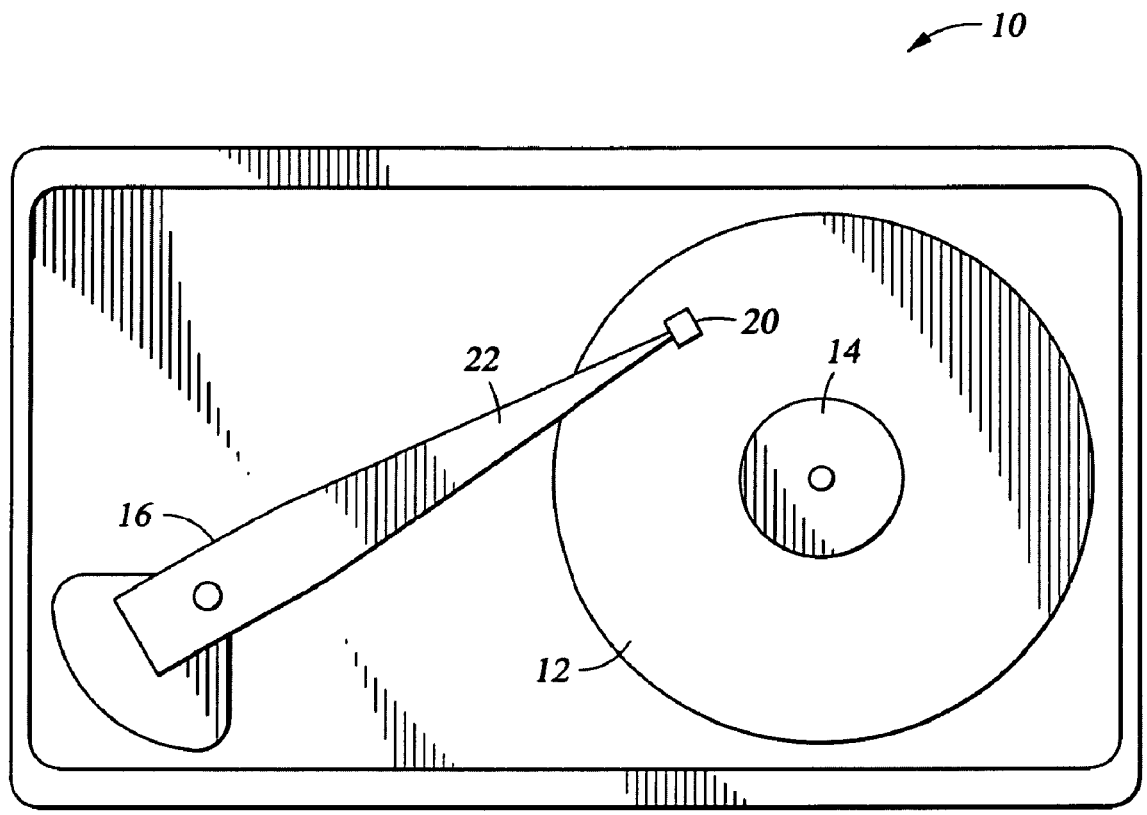
FIG. 1 is a block diagram depicting a hard disk drive according to one embodiment of the invention.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

Various options for the magnetoresistance sensor include a giant magnetoresistance (GMR) sensor used in either a current-in-plane (CIP) or a current-perpendicular-to-plane (CPP) mode or a tunneling magnetoresistance (TMR) sensor used in a CPP mode. Using the TMR sensor as an example, an exemplary sequence of layer depositions referred to as a bottom pinned or bottom TMR stack forms in order the seed layer, the antiferromagnetic layer, the pinned layers, the barrier layer, the free layer and the capping layer. Extendibility of the bottom TMR stack to lower junction resistances and higher recording areal densities relies on decreasing thickness of the barrier layer. However, depositing on the antiferromagnetic layer makes a top surface of the pinned layer and consequently the barrier layer rough, thereby setting a limit on how thin the barrier layer can be made. Problems with roughness of the barrier layer as the barrier layer decreases in thickness include performance issues caused by increased coupling between the pinned layers and the free layer and potential for breakdown from thermal instability.

For a top pinned or top TMR stack, layer deposition occurs in reverse to provide in order the seed layer, the free layer, the barrier layer, the pinned layers, the antiferromagnetic layer and the capping layer. The top TMR stack thus eliminates the antiferromagnetic layer being a contributing source to any roughness as previously mentioned since the antiferromagnetic layer is above the barrier layer. However, this configuration utilizing the top TMR stack reduces, compared to the bottom TMR stack, pinning strength of the pinned layer. Such undesirable reduction in the pinning strength may make the top TMR stack unusable in the sensor.

Embodiments of the invention provide magnetoresistive sensors with improved properties and that can enable achieving desired junction resistances and recording areal densities.

Embodiments of the invention relate to TMR sensors used in a CPP mode or GMR sensors used in either a CPP or CIP mode. By way of example, the TMR sensors shown herein include configurations that are arranged as a top TMR stack. One of two antiparallel layers of pinned layers within the TMR stack may be subdivided by a separation layer. In one embodiment, tantalum forms the separation layer that is inserted in a reference layer, which is one of the pinned layers and is between a barrier layer and an antiparallel coupling layer that enables antiparallel coupling between the reference layer and a keeper layer of the pinned layers. The barrier layer deposited on a free layer of the TMR stack separates the pinned layers from the free layer such that a TMR effect is detectable when a sense current tunnels across the barrier layer.

FIG. 1 illustrates a hard disk drive 10 that includes a hard disk 12 mounted upon a motorized spindle 14. An actuator arm 16 is pivotally mounted within the hard disk drive 10 with a slider 20 disposed upon a distal end 22 of the actuator arm 16. During operation of the hard disk drive 10, the hard disk 12 rotates upon the spindle 14 and the slider 20 acts as an air bearing surface (ABS) adapted for flying above the surface of the hard disk 12. The slider 20 includes a substrate base upon which various layers and structures that form a magnetic read/write head are fabricated. Magnetic read/write heads disclosed herein can be fabricated in large quantities upon a substrate and subsequently sliced into discrete magnetic read/write heads for use in devices such as the hard disk drive 10.

Figure 2:
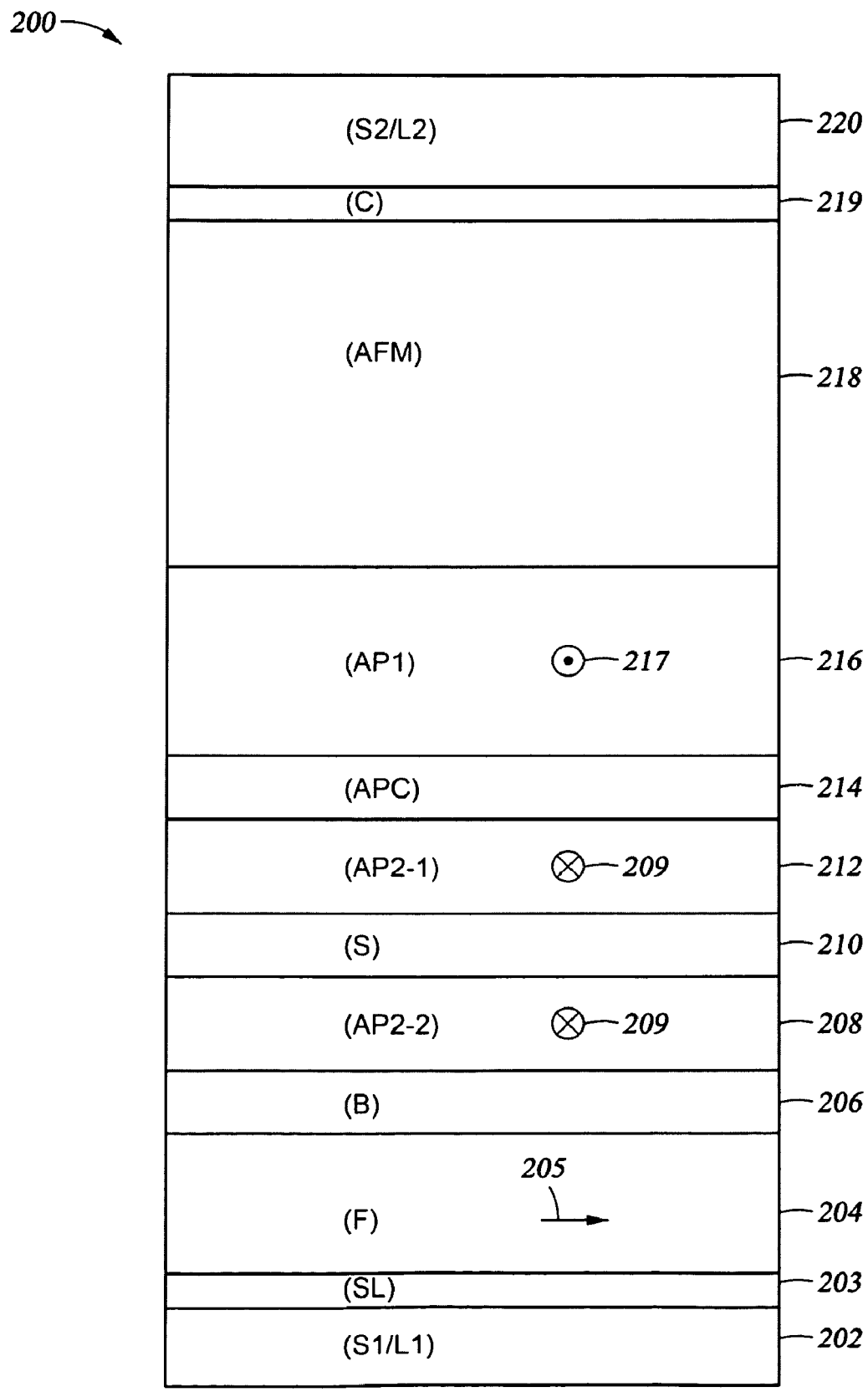
FIG. 2 is a block diagram depicting exemplary layers included in a current-perpendicular-to-plane tunneling magnetoresistance read sensor according to one embodiment of the invention.

FIG. 2 shows exemplary layers included in a TMR stack 200 forming part of the magnetic read/write head within the slider 20 (shown in FIG. 1). As an exemplary MR sensor configuration for incorporating embodiments of the invention, the TMR stack 200 includes a first shield layer (S1) 202, a seed layer (SL) 203, a free layer (F) 204, a barrier layer (B) 206 and a pinning structure. A sub-second pinned layer (AP2-2) 208, a separation layer (S) 210, a second pinned layer (AP2-1) 212, an antiparallel coupling layer (APC) 214 and a first pinned layer (AP1) 216 form the pinning structure. The TMR stack 200 further includes an antiferromagnetic pinning layer (AFM) 204, a capping layer (C) 219, and a second shield layer (S2) 220.

The first and second shield layers 202, 220 may serve as electrically conductive leads (L1, L2) for sensing layers formed between and in contact with the shield layers 202, 220. The barrier layer 206 composed of a nonmagnetic dielectric such as magnesium oxide (MgO) separates the sub-second pinned layer 208 from the free layer 204 disposed above the seed layer 203. In some embodiments that utilize a CPP GMR sensor, an electrically conducting spacer layer made of a nonmagnetic material such as copper (Cu) forms or otherwise replaces the barrier layer 206. The free layer 204 provides a magnetic moment 205 directed from right to left or from left to right and may have a thickness less than about 6.0 nanometers (nm). In operation, a field signal from the disk 12 (shown in FIG. 1) rotates the magnetic moment 205 away from being parallel to the ABS changing resistance of tunneling current across the barrier layer 206.

The separation layer 210 divides the second pinned layer 212 from the sub-second pinned layer 208 disposed above the barrier layer 206. For some embodiments, composition of the separation layer 210 may include one or more nonmagnetic electrically conductive metals, such as but not limited to Ta, Nb, V, Hf, Zr, Ti, W, Mo, Y, Mg, Cu, Al or their alloys, with a crystal structure that promotes desired crystallographic texture and grain growth of subsequent layers. For example, the separation layer 210 may exhibit a cubic structure. Composition and thickness of the separation layer 210 is selected to provide strong parallel coupling and not antiparallel coupling. The separation layer 210 changes texture of the second pinned layer 212 from that of the sub-second pinned layer 208 since the sub-second pinned layers 208 is grown on the barrier layer 206 that has a different structure from the separation layer 210. While thickness of the separation layer 210 needs to be sufficient to provide benefits as discussed herein, the thickness of the separation layer 210 cannot exceed a threshold resulting in decoupling of the second and sub-second pinned layers 212, 208 that are made of ferromagnetic material. For some embodiments, the thickness of the separation layer 210 is less than about 1.2 nm, and thickness of each of the second and sub-second pinned layers 212, 208 is less than about 2.5 nm.

The antiparallel coupling layer 214, such as nonmagnetic ruthenium (Ru), disposed above the second pinned layer 212 separates the second pinned layer 212 from the first pinned layer 216. Thickness of the antiparallel coupling layer 214 may be less than about 2.0 nm. Due to antiparallel coupling across the antiparallel coupling layer 214 between a magnetic moment 217 of the first pinned layer 216 and a magnetic moment 209 of the second pinned layer 212, the direction of the magnetic moments 209, 217 are antiparallel. The antiferromagnetic pinning layer 218 can be composed of iridium manganese (IrMn) and disposed on the first pinned layer 216. Additionally, the antiferromagnetic pinning layer 218 pins the magnetic moment 217 of the first pinned layer 216 in a direction perpendicular to ABS as a result of the first pinned layer 216 being exchange coupled to the antiferromagnetic pinning layer 218. Thickness of the first pinned layer 216 that is made of ferromagnetic material may be less than about 5.0 nm. To exhibit strong antiferromagnetism, the thickness of the antiferromagnetic pinning layer 218 should be larger than a critical thickness of 4.0 nm and may be less than about 10.0 nm in case of IrMn.

For one embodiment, a method fabricates the TMR stack 200. The method described below represents a specific embodiment of the TMR stack 200 from which data presented herein corresponds. However, embodiments of the invention are applicable to TMR stacks with different AP1, AP2-1, AP2-2, F, AFM, SL and C layers. For example, the free layer and/or the pinned layers may include cobalt and iron with additions such as one or more of boron (B), hafnium (Hf), zirconium (Zr), titanium (Ti), molybdenum (Mo) and tungsten (W). The seed layer 203 of Ta is deposited on top of the first shield layer 202. Depositing cobalt iron boron (CoFeB) on the seed layer 203 creates the free layer 204 upon which MgO is deposited to provide the barrier layer 206. The sub-second pinned layer 208, the separation layer 210, the second pinned layer 212, the antiparallel coupling layer 214, and the first pinned layer 216 respectively form by sequential deposition of cobalt iron (CoFe), Ta, CoFe, Ru, and CoFe. Deposition of IrMn onto the first pinned layer 216 makes the antiferromagnetic pinning layer 204. Before depositing the second shield layer 220, the capping layer 219 is deposited on the antiferromagnetic pinning layer 204 and may be formed by depositing in order Ru, Ta, and Ru. The capping layer 219 is used as a top lead.

The interfacial coupling energy $j_{AF}$ defines the strength of exchange coupling between the AFM and AP1. The interfacial coupling energy $j_{Ru}$ defines the strength of antiparallel exchange coupling between AP1 and AP2-1. A combination of (i) the exchange coupling of the first pinned layer 216 to the antiferromagnetic pinning layer 218 ($j_{AF}$) and (ii) the antiparallel coupling through the antiparallel coupling layer 214 ($j_{Ru}$) define rigidity of the pinned layers 208, 212, 216. The rigidity of the pinned layers 208, 212, 216 desirably increases with both higher $j_{AF}$ and $j_{Ru}$.

Figure 3:
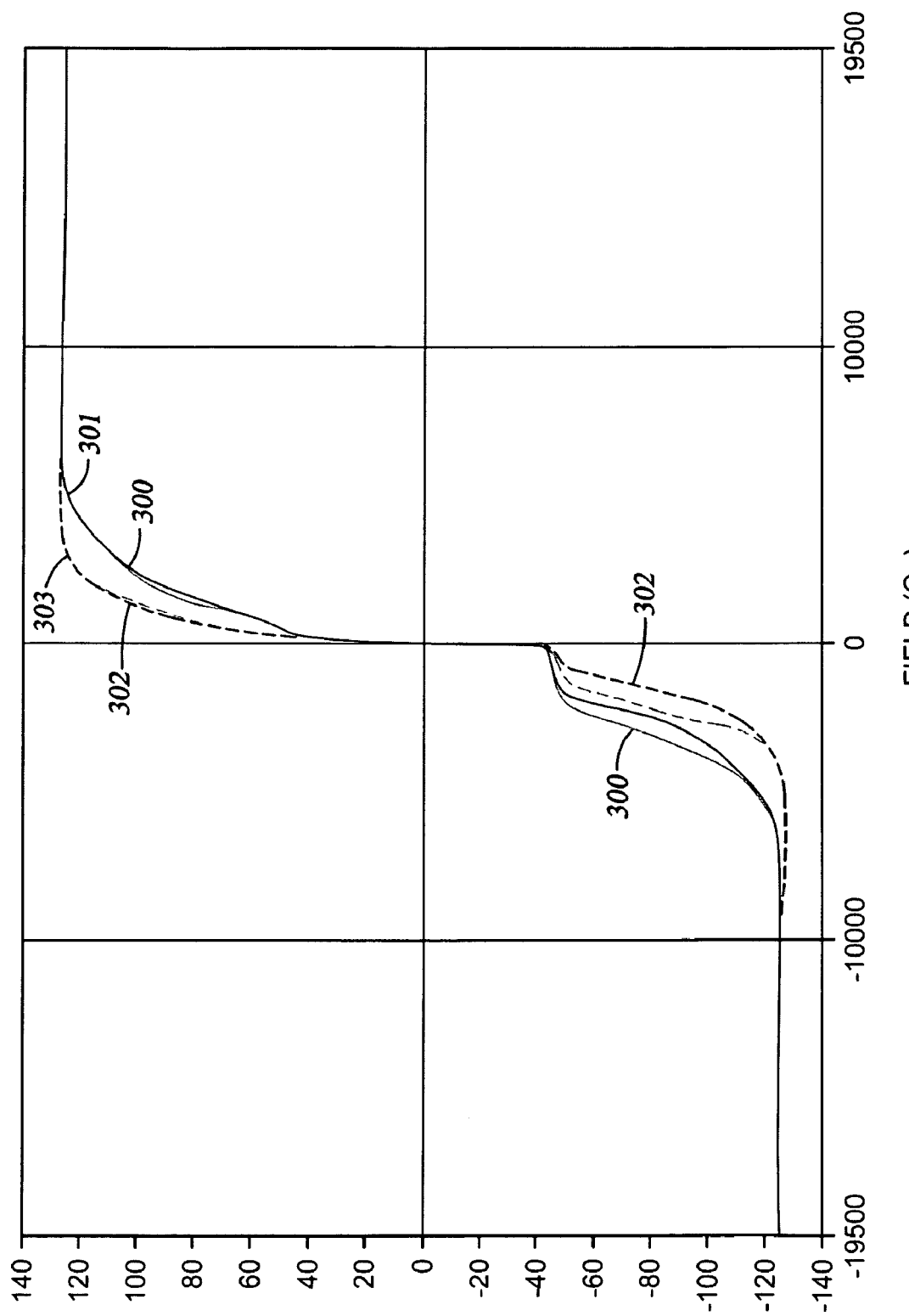
FIG. 3 is a graph depicting hysteresis loops of a TMR sensor having a tantalum layer inserted in a pinned structure according to one embodiment of the invention and a comparative corresponding TMR sensor without the tantalum layer.

FIG. 3 illustrates a first hysteresis loop (solid line) 300 of the TMR sensor 200 of the specific embodiment and a second hysteresis loop (dashed line) 302 of a corresponding comparative TMR sensor without the separation layer 210 but otherwise the same. Insertion of the separation layer 210 causes saturation field which is proportional to $j_{Ru}$ to nearly double. In particular, the comparative TMR sensor saturates at about 3000 Oersteds (Oe) as identified by a comparative maximum point 303 while the TMR sensor 200 with the separation layer 210 does not saturate until about 6000 Oe as identified by a maximum point 301.

Further, a ferromagnetic coupling field ($H_{ex}$) identifies interlayer coupling between the free layer 204 and the sub-second pinned layer 208. For a given barrier layer thickness, the smoother the barrier layer 206, the smaller the $H_{ex}$. Thus, $H_{ex}$ is a measure of the roughness of the barrier layer 206 for a given barrier thickness. Most importantly, the smoother the barrier layer of a given thickness, the better sensor performance and reliability. Therefore, improving barrier smoothness or reducing $H_{ex}$ becomes particularly important as RA decreases with increase of the recording areal density. Table 1 below sets forth such foregoing properties as related to stack parameters including resistance times area (RA) given as ohms times square micrometer ($\Omega*\mu m^2$) for two RA regimes, i.e. RA~1 $\Omega*\mu m^2$ and RA~2 $\Omega*\mu m^2$. The resistance area varies based on selection for thickness of the barrier layer 206 (multiple thicknesses tested as shown in Table 1 and FIGS. 4 and 5) such that decreasing thickness of the barrier layer 206 results in lowering of the RA.

TABLE 1

| | No separation layer 210 | Separation layer 210 | No separation layer 210 | Separation layer 210 |
|---|---|---|---|---|
| RA ($\Omega*\mu m^2$) | 1.04 | .98 | 2.1 | 2.0 |
| $H_{ex}$ (Oe) | 93.03 | 79.1 | 59.5 | 49.16 |
| $j_{AF}$ (erg/cm$^2$) | 0.27 | 0.27 | 0.27 | 0.27 |
| $j_{Ru}$ (erg/cm$^2$) | 0.35 | 0.57 | 0.31 | 0.49 |

Figure 4:
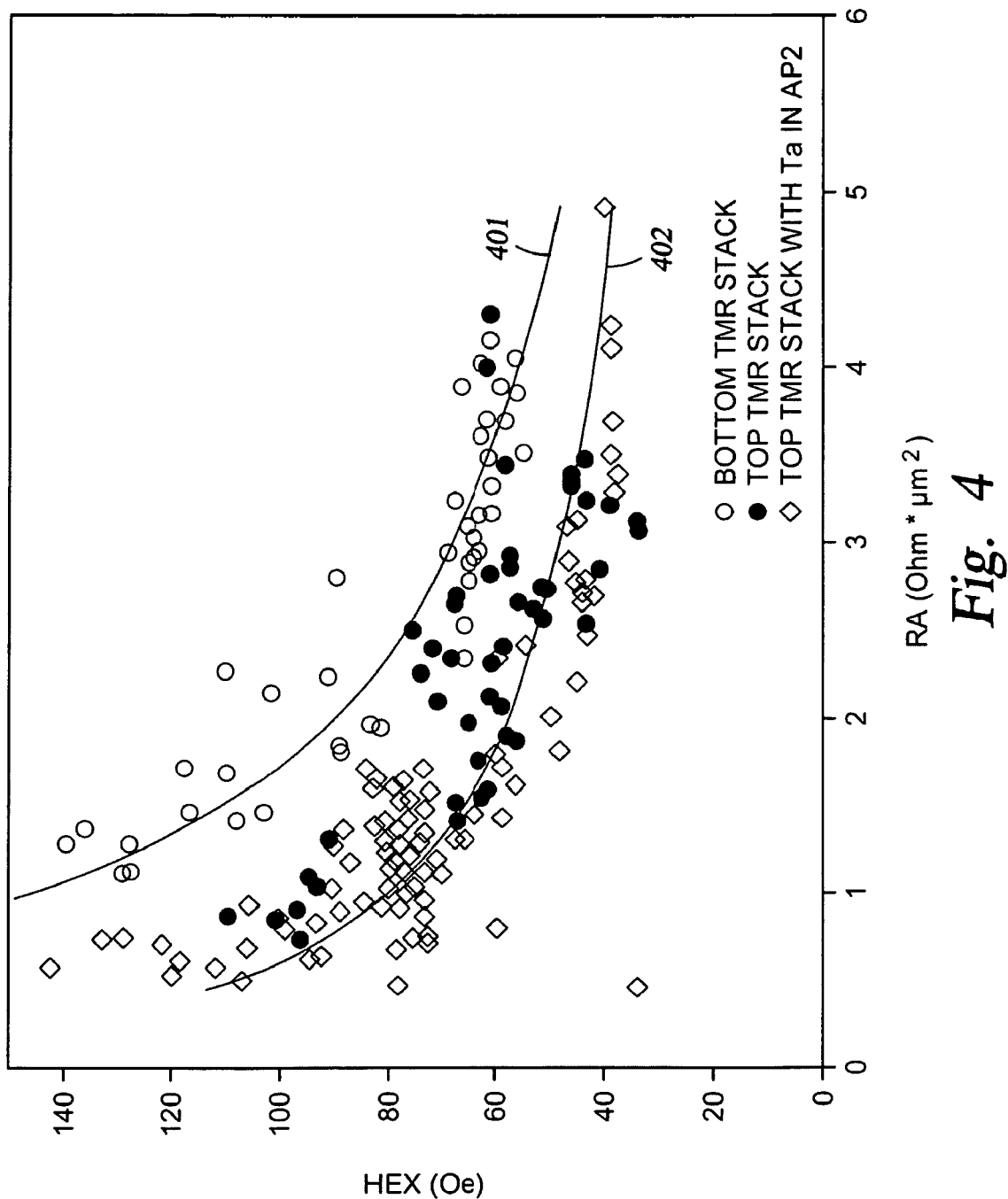
FIG. 4 is a graph depicting a ferromagnetic coupling field versus resistance area for the TMR sensor according to one embodiment of the invention and comparative corresponding top and bottom TMR sensors without the tantalum layer.

As seen in results from Table 1, pinning became stronger with presence of the separation layer 210. Since the $j_{AF}$ stayed the same, the separation layer 210 improved the antiparallel coupling strength $j_{Ru}$ between the first pinned layer 216 and the second pinned layer 212 but not the exchange coupling $j_{AF}$ between the first pinned layer 216 and the antiferromagnetic pinning layer 204. FIG. 4 shows that even though the coupling field $H_{ex}$ for the top TMR sensors without the separation layer 210 is already 40% lower than an analogous bottom TMR stack configuration, insertion of the separation layer 210 further lowered the coupling field $H_{ex}$ while improving strength of antiparallel exchange coupling between AP1 and AP2-1 as manifested by higher saturation field 301 in FIG. 3 or higher $j_{Ru}$ in Table 1.

FIG. 4 further illustrates this lowering of the coupling field $H_{ex}$. A plot includes data from the TMR sensor of the specific embodiment and corresponding comparative top and bottom TMR sensors without the separation layer 210. As a comparison, a first curve 401 corresponds to the coupling field $H_{ex}$ as a function of RA for the comparative bottom TMR sensor. The first curve trends downward from about 140 Oe at an RA of 1.0 $\Omega*\mu m^2$ to 60 Oe at an RA of 4.0 $\Omega*\mu m^2$. Such a high coupling field $H_{ex}$ at lower resistance areas for the comparative bottom TMR sensor prevents its use at these lower resistance areas. A second curve representing the TMR sensor of the specific embodiment trends downward from about 80 Oe at an RA of 1.0 $\Omega*\mu m^2$ to 40 Oe at an RA of 4.0 $\Omega*\mu m^2$.

Figure 5:
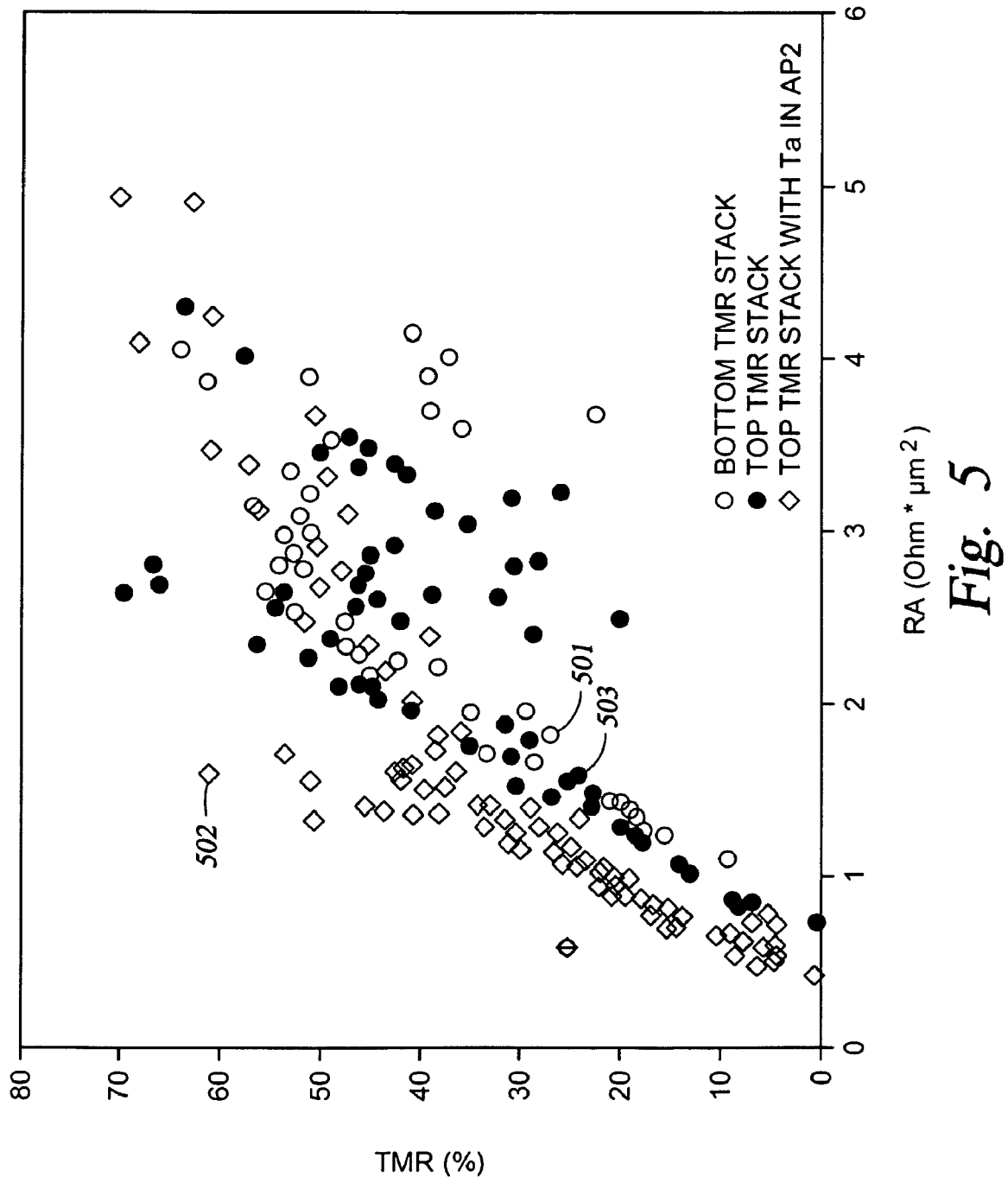
FIG. 5 is a graph depicting TMR versus resistance area for the TMR sensor according to one embodiment of the invention and comparative corresponding top and bottom TMR sensors without the tantalum layer.

FIG. 5 depicts data of TMR coefficient versus RA for the TMR sensor of the specific embodiment and corresponding comparative top and bottom TMR sensors without the separation layer 210. The TMR of the sensor is defined as a percentage represented by change in resistance as the orientation of the magnetic moment 205 of the free layer 204 and magnetic moment 209 of the sub-second pinned layer 208 is changed from parallel to anti-parallel divided by resistance for the parallel state. While a tool used to measure the TMR on this sheet film level may not have enabled reliable measurements when the coupling field $H_{ex}$ as depicted in FIG. 4 exceeded 100 Oe, the data nevertheless demonstrates that the TMR was at least not adversely affected by the insertion of the separation layer 210. At most points including those where reliability of the measurement tool is better (for RA>1 $\Omega*\mu m^2$) the TMR is about the same or higher for the TMR sensor of the specific embodiment (diamonds 502) than the comparative top TMR sensors (filled circles 503) without the separation layer 210 or bottom TMR sensors (open circles 501) without the separation layer 210.

For some embodiments, insertion of the separation layer 210 in the top TMR sensor stack provide benefits that include: (1) increasing the antiparallel coupling strength $j_{Ru}$, between first pinned layer 216 and sub-second pinned layer 212 and (2) reducing the interlayer coupling $H_{ex}$ between the free layer 204 and the sub-second pinned layer 208. At the same time, insertion of the separation layer 210 in the top TMR sensor stack does not degrade the TMR coefficient.

Figure 6:
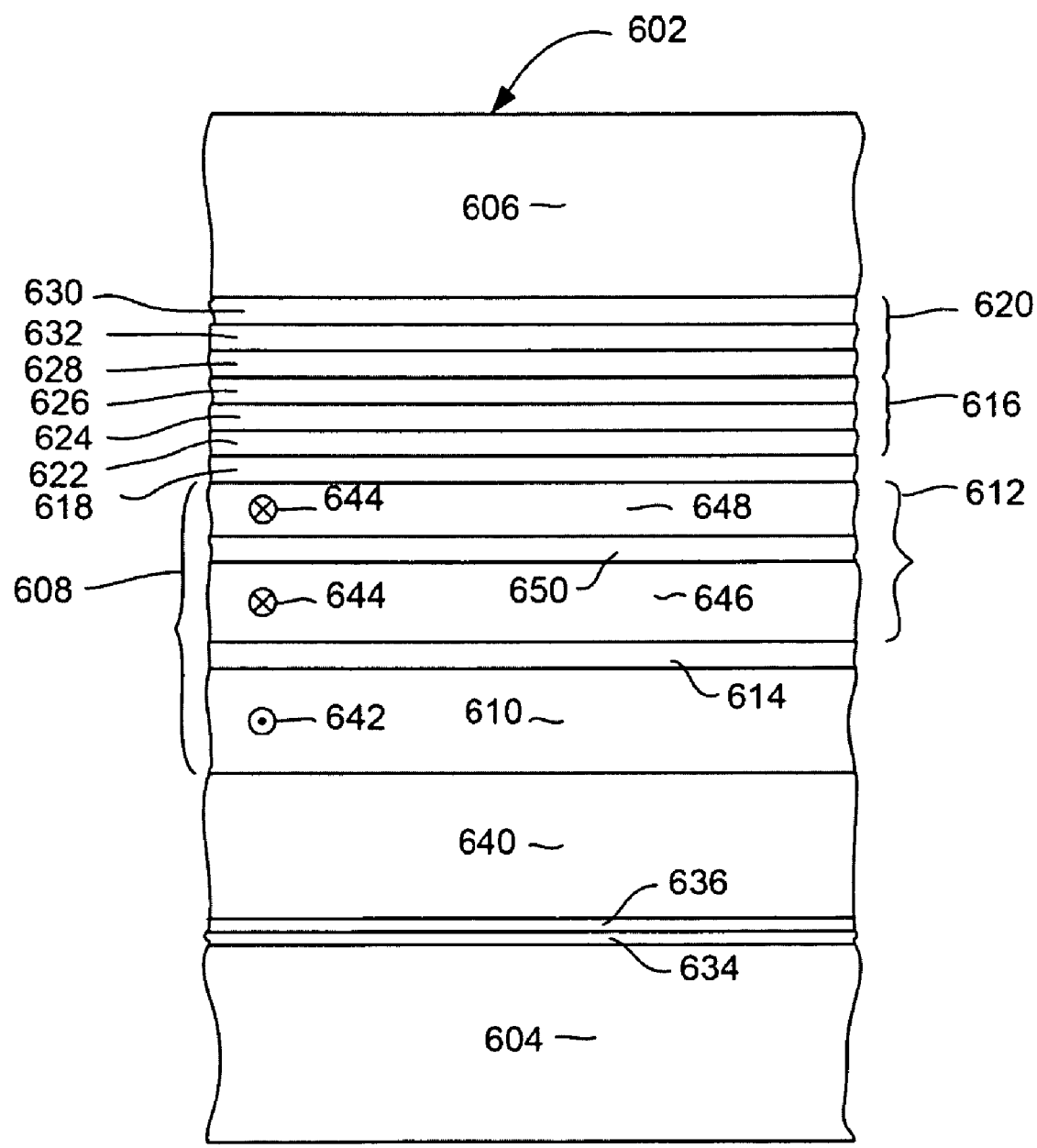
FIG. 6 is a block diagram depicting exemplary layers included in a current-perpendicular-to-plane tunneling magnetoresistance read sensor according to an alternate embodiment of the invention

High TMR, Low RA TMR Sensor:

FIG. 6, illustrates an embodiment of the invention that exhibits high TMR values, low RA values, and also maintains high pinning. FIG. 6 shows a sensor 602 having a sensor stack that is sandwiched between first and second electrically conductive shields 604, 606. The sensor 602 includes an AP coupled pinned layer structure 608, that includes an AP1 layer 610 and an AP2 layer 612, both of which are antiparallel coupled with one another across an antiparallel coupling layer 614. The AP1 layer can be constructed of CoFe. The sensor also includes a free layer structure 616 that is separated from the pinned layer structure 608 by a barrier layer 618, that can be constructed of MgO. If the sensor 602 is constructed as a GMR sensor, then the layer 618 will be an electrically conductive spacer layer such as Cu. A capping structure 620 can be provided between the free layer 616 and the upper shield 606.

The free layer 616 can be a multilayer magnetic structure that can include a layer 622 of CoFe adjacent to the barrier layer 618, a layer of CoFeB 624 formed on the layer 622 and a layer of CoFeHf 626 formed on the CoFeB layer 624. The free layer could also be a more simple bi-layer free layer including a layer of CoFe and a layer of CoFeB. The capping layer 620 can also be a multi layer structure and can include first and second layers of Ru 628, 630 and a layer of Ta 632 sandwiched therebetween.

One or more seed layers may be provided at the bottom of the sensor stack for initiating a desired crystalline structure in the above layers. The seed layers may include a thin layer of Ta 634 and a layer of Ru 636 formed on the Ta layer. A layer of antiferromagnetic material 640 such as IrMn is formed adjacent to and exchange coupled with the AP1 layer 610 to pin the magnetization 642 of the AP1 layer in a desired direction perpendicular to the air bearing surface. Strong antiparallel coupling between the AP1 and AP2 layers also pins the magnetization 644 of the AP2 layer in a direction opposite to that of AP1.

The AP2 layer 612 can be constructed as a multilayer structure that increases TMR while reducing RA and providing strong pinning. The AP2 layer includes an AP2(a) sub-layer 646 formed adjacent to the AP coupling layer 614, and an AP2(b) sub-layer 648 located adjacent to the barrier layer 618. A very thin layer of Ta 650 is disposed between the AP2(a) layer 646 and the AP2(b) 648. The AP2(a) layer 646 and AP2(b) layer 648 can each be constructed of CoFeB.

The Ta layer 650 should be thin enough so that the AP2(a) and AP2(b) layers 646, 648 do not magnetically decouple. This is to ensure that the magnetizations 644 stay in the same direction. The Ta layer 650 is preferably less than 3 Angstroms thick, and more preferably 0.5-1.5 Angstroms thick. This is much thinner than the Ta 210 described above. The thin nano-crystalline layer 650, inserted into the AP2 layer 612 increases the crystallinety of the AP2(b) layer 646 and barrier 618. Other nanocrystalline layers like NiTa, CrTa, TaNb, ZrX (where X is Ta, Nb, Cr or Hf) could be used in the layer 650 also, although the layer 650 is most preferably Ta.

Simply placing such a Ta layer into the middle of an AP2 layer can increase TMR values. However, pinning strength may suffer as a result. The inventors have found, however, that if the thickness of AP2(a) 646 is increased and the thickness of AP2(b) 648 is decreased the pinning strength does not suffer. This allows one to enjoy the increased TMR and decreased RA values, without suffering a loss of pinning strength. If the nano-crystalline layer 650 is moved closer to the coupling layer 614, TMR improves, but pinning suffers. On the other hand, if the nano-crystalline layer 650 is moved closer to the barrier layer 618, pinning strength improves, but TMR decreases only slightly. However the presence of the nano-crystalline layer provides such a large overall increase in TMR, that the slight decrease in moving the nano-crystalline layer closer to the barrier layer 618 is negligible. Therefore, the thickness of the AP2(a) layer 646 is preferably made to be greater than that of the AP2(b) layer 648. More specifically, the AP2(a) layer 646 is preferably at least 25% thicker than the AP2(b) layer.

In addition, it can be seen that the embodiment described in FIG. 6, is a bottom spin valve, having a pinned layer structure 208 that is below the free layer structure 616. This is different from the embodiment described above with reference to FIG. 2. The bottom spin valve structure shown in FIG. 6 provides the above described TMR increase, as well as exhibiting strong pinning.

While the foregoing is directed to embodiments of the present invention, other and further embodiments of the invention may be devised without departing from the basic scope thereof, and the scope thereof is determined by the claims that follow.

What is claimed is:

1. A magnetic head, comprising:
a magnetoresistive read sensor including a free layer, a barrier layer and a pinned structure between the barrier layer and an antiferromagnetic pinning layer, the pinned structure comprising:
a first pinned layer (AP1) exchange coupled to the antiferromagnetic pinning layer;
an antiparallel coupling layer; and
a second pinned stack disposed between the barrier layer and the antiparallel coupling layer and antiparallel coupled to the first pinned layer, wherein the second pinned stack includes a first magnetic layer (AP2(a)), a second magnetic layer (AP2(b)) and thin layer of Ta sandwiched between said first magnetic layer (AP2(a)) and said second magnetic layer (AP2(b)), and wherein said second magnetic layer (AP2(b)) is located between the thin layer of Ta and the barrier layer, and said first magnetic layer (AP2(a)) has a greater thickness than said second magnetic layer (AP2(b)).

2. The magnetic head of claim 1, wherein said first magnetic layer (AP2(a)) is at least 25 percent thicker than said second magnetic layer (AP2(b)).

3. The magnetic head of claim 2, wherein said first magnetic layer (AP2(a)) and said second magnetic layer (AP2(b)) comprise ferromagnetic material.

4. The magnetic head of claim 2, wherein said first magnetic layer (AP2(a)) and said second magnetic layer (AP2(b)) comprise cobalt-iron-boron (CoFeB).

5. The magnetic head of claim 1, wherein the thin layer of Ta has a thickness that is less than 3 Angstroms but greater than 0 Angstroms.

6. The magnetic head of claim 1, wherein the thin layer of Ta has a thickness 0.5 to 1.5 Angstroms.

7. The magnetic head of claim 1, wherein the barrier layer comprises a dielectric material.

8. The magnetic head of claim 1, wherein the barrier layer comprises magnesium oxide (MgO).

9. The magnetic head of claim 1, wherein pinning of said first magnetic layer AP2(a)) and second magnetic layer (AP2(b)) establishes a common magnetic moment for both the said first and second magnetic layers.

10. A magnetic head as in claim 1 wherein said first pinned layer (AP1) comprises CoFe and said first magnetic layer (AP2(a)) and said second magnetic layer (AP2(b)) each comprise CoFeB.

11. A magnetic head as in claim 1 wherein the magnetoresistive read sensor is a bottom spin valve.

12. A magnetic head, comprising:
a magnetoresistive read sensor including a free layer, a barrier layer and a pinned structure between the barrier layer and an antiferromagnetic pinning layer, the pinned structure comprising:
a first pinned layer (AP1) exchange coupled to the antiferromagnetic pinning layer;
an antiparallel coupling layer; and
a second pinned stack disposed between the barrier layer and the antiparallel coupling layer and antiparallel coupled to the first pinned layer, wherein the second pinned stack includes a compositionally distinct nanocrystalline layer between a first magnetic layer (AP2(a)) and a second magnetic layer (AP2(b)), wherein said second magnetic layer (AP2(b)) is located between the antiparallel coupling layer and the barrier layer, and wherein said first magnetic layer (AP2(a)) has a greater thickness than said second magnetic layer (AP2(b)), and wherein the separation layer comprises a material selected from the group consisting of, NiTa, CrTa, TaNb and ZrX {where X is Ta, Nb, Cr or Hf}.

13. A magnetic head as in claim 12 wherein the compositionally distinct nanocrystalline layer has a thickness less than 3 Angstroms but neater than 0 Angstroms.

14. A magnetic head as in claim 12 wherein the compositionally distinct nanocrystalline layer has a thickness of 0.5 to 1.5 Angstroms.

15. A magnetic head as in claim 12 wherein said first magnetic layer (AP2(a)) is at least 25 percent thicker than said second magnetic layer (AP2(b)).

16. A magnetic head as in claim 12 wherein said first magnetic layer (AP2(a)) and said second magnetic layer (AP2(b)) each comprise CoFeB.

17. A magnetic head as in claim 12 wherein said first pinned layer (AP1) comprises CoFe and said first magnetic layer (AP2(a)) and said second magnetic layer (AP2(b)) each comprise CoFeB.

18. A magnetic head as in claim 12 wherein the magnetoresistive sensor is a bottom spin valve.

* * * * *